(12) United States Patent
Furukawa et al.

(10) Patent No.: US 7,633,303 B2
(45) Date of Patent: Dec. 15, 2009

(54) SEMICONDUCTOR WAFER INSPECTION APPARATUS

(75) Inventors: Takashi Furukawa, Sagamihara (JP); Natsuki Tsuno, Kunitachi (JP); Zhaohui Cheng, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/062,940

(22) Filed: Apr. 4, 2008

(65) Prior Publication Data

US 2008/0246497 A1    Oct. 9, 2008

(30) Foreign Application Priority Data

Apr. 6, 2007    (JP) .............................. 2007-100029

(51) Int. Cl.
*G01R 31/305* (2006.01)
(52) U.S. Cl. .................................... 324/751
(58) Field of Classification Search ........................ None
See application file for complete search history.

(56) References Cited

U.S. PATENT DOCUMENTS

| | | | | |
|---|---|---|---|---|
| 4,460,866 A | * | 7/1984 | Feuerbaum et al. | 324/649 |
| 4,695,794 A | * | 9/1987 | Bargett et al. | 324/751 |
| 4,851,768 A | * | 7/1989 | Yoshizawa et al. | 324/751 |
| 5,097,204 A | * | 3/1992 | Yoshizawa et al. | 324/751 |
| 6,002,792 A | * | 12/1999 | Oguri et al. | 324/750 |
| 6,329,826 B1 | * | 12/2001 | Shinada et al. | 324/765 |
| 6,344,750 B1 | * | 2/2002 | Lo et al. | 324/765 |
| 6,583,634 B1 | * | 6/2003 | Nozoe et al. | 324/751 |
| 6,859,060 B2 | * | 2/2005 | Neo et al. | 324/765 |
| 2006/0054813 A1 | * | 3/2006 | Nokuo et al. | 250/307 |
| 2006/0097165 A1 | * | 5/2006 | Ando et al. | 250/310 |

FOREIGN PATENT DOCUMENTS

| | | |
|---|---|---|
| JP | 3-194915 | 8/1991 |
| JP | 2006-013049 | 1/2006 |

* cited by examiner

*Primary Examiner*—Jermele M Hollington
(74) *Attorney, Agent, or Firm*—Mattingly & Malur, PC

(57) ABSTRACT

Efficiency of a charging processing of an insulator sample is improved. And, an electron optical system is adjusted according to a contact resistance value of the insulator sample. Breakdown of a sample is performed before the charging processing, and then, the charging processing is performed. A control parameter of the electron optical system is selected using a result of a resistance value of the sample for checking the breakdown.

5 Claims, 7 Drawing Sheets

SEMICONDUCTOR WAFER INSPECTION APPARATUS

CROSS-REFERENCE TO RELATED APPLICATION

The present application claims priority from Japanese Patent Application No. JP 2007-100029 filed on Apr. 6, 2007, the content of which is hereby incorporated by reference into this application.

TECHNICAL FIELD OF THE INVENTION

The present invention relates to a semiconductor wafer inspection apparatus using an electron beam, in particular, to a method and an apparatus enhancing accuracy of control of a charged state of a sample surface and a method and an apparatus for adjustment of an electron optical system using the same.

BACKGROUND OF THE INVENTION

When inspecting a sample such as a semiconductor wafer using an electron beam inspection apparatus, a pattern shape image or an electrical defect image is obtained by controlling an accumulation amount of charges (hereinafter referred to as charging) to a pattern portion formed over a surface of the wafer. In particular, when the defect image is to be obtained, a contrast image (hereinafter referred to as a potential contrast image) caused by charged potential difference generated between a defect part and a normal part is required, and therefore, charge accumulation amount control (charging control) being uniform and having high accuracy is necessary. In order to perform charging control by electron beam irradiation, grounding of the wafer or voltage application to the wafer is necessary. However, if the wafer surface is covered with an insulation film such as an oxide, the insulation film is charged in excess if the grounding is insufficient, and distortion of the pattern shape image by charging and poor contrast of the potential contrast image are caused. Therefore, it is necessary to ground the wafer, and as a method thereof, a method of grounding the wafer by contacting a ground electrode to the wafer surface and preventing excess charging is conventionally known. For example, when the ground electrode is made to contact with the wafer surface, a contact resistance generated between the wafer covered with the insulation film and the ground electrode becomes a problem. However, there are a method of reducing a contact resistance value by carrying a constant current (surface activation current) between the ground electrode and the wafer as disclosed in Japanese Patent Application Laid-Open Publication No. 2006-13049 (Patent Document 1), and an antistatic method in which an electron beam is irradiated to a portion to be unnecessary in the wafer surface, local charging is generated to cause breakdown at a peripheral edge portion of the wafer, grounding to a portion of the breakdown is made, and as a result, the contact resistance is reduced as disclosed in Japanese Patent Application Laid-Open Publication No. 3-194915 (Patent Document 2).

SUMMARY OF THE INVENTION

The wafer as an inspection sample varies in a type and a coverage amount of the insulation film according to a process thereof, and therefore, the contact resistance value has to be managed according to the type of the wafer. This is because a charging amount of the wafer surface is determined by a ratio between a resistance value of the wafer surface and the contact resistance value between the ground electrode and the wafer. In Patent document 1, it is described that the contact resistance value between the ground electrode and the wafer is preferable to be smaller than or equal to 20 MΩ. However, in actual inspection, as described above, the ratio between the resistance value of the wafer surface irradiated with the electron beam and the contact resistance value between the ground electrode and the wafer is important. In high speed inspection by a large current electron beam performed in the semiconductor wafer inspection apparatus addressed in the present invention, even if the contact resistance value is small, the charged state at the wafer surface changes depending on the resistance value of the wafer surface, and as a result, the distortion of the pattern shape image by charging and the poor contrast of the potential contrast image may occur. Thus, it is necessary to control an optical condition of an electron optical system and a voltage applied to a charging control electrode normally arranged immediately above the sample so that the charged state of an observation region becomes optimum according to the ratio between the resistance value of the wafer surface irradiated with the electron beam and the contact resistance value between the ground electrode and the wafer.

As described above, in the method disclosed in Patent Document 1, only the contact resistance value between the ground electrode and the wafer is managed, and therefore, control which is important in the actual inspection, that is, control of the resistance value between the ground electrode and the wafer according to the resistance value of the wafer surface including an inspection region having the pattern portion formed is not performed, and thereby, problems such as potential fluctuation at the wafer surface and non-uniform potential in the surface caused by variation in the surface resistance value and lack of reduction of the contact resistance value occur.

Also in the method disclosed in Patent Document 2, since a method of reducing the contact resistance by electron beam irradiation outside the inspecting region is employed, management of the contact resistance value obtained in comparison with the resistance value of the wafer surface is not performed in the same manner as Patent Document 1, and therefore, there are problems similar to those of Patent Document 1.

In order to solve the above problems, the present invention comprises a means for measuring a contact resistance value between the wafer and the ground electrode, a means for inputting wafer information related to the wafer surface resistance value, and a means (charging control electrode) for controlling the optical condition of the electron optical system and the charged state of the wafer surface by comparing the contact resistance value and the wafer surface resistance value, and thereby, an optimum inspection condition of the wafer can be determined easily, and the stable pattern shape image and the stable defect image of the wafer can be obtained.

According to the present invention, management of the resistance value between the wafer surface and the ground electrode and control of charging of the wafer surface by the management can be performed, and the stable pattern shape image and the stable defect image can be obtained.

BRIEF DESCRIPTIONS OF THE DRAWINGS

DESCRIPTIONS OF THE PREFERRED EMBODIMENTS

First Embodiment

Figure 1:
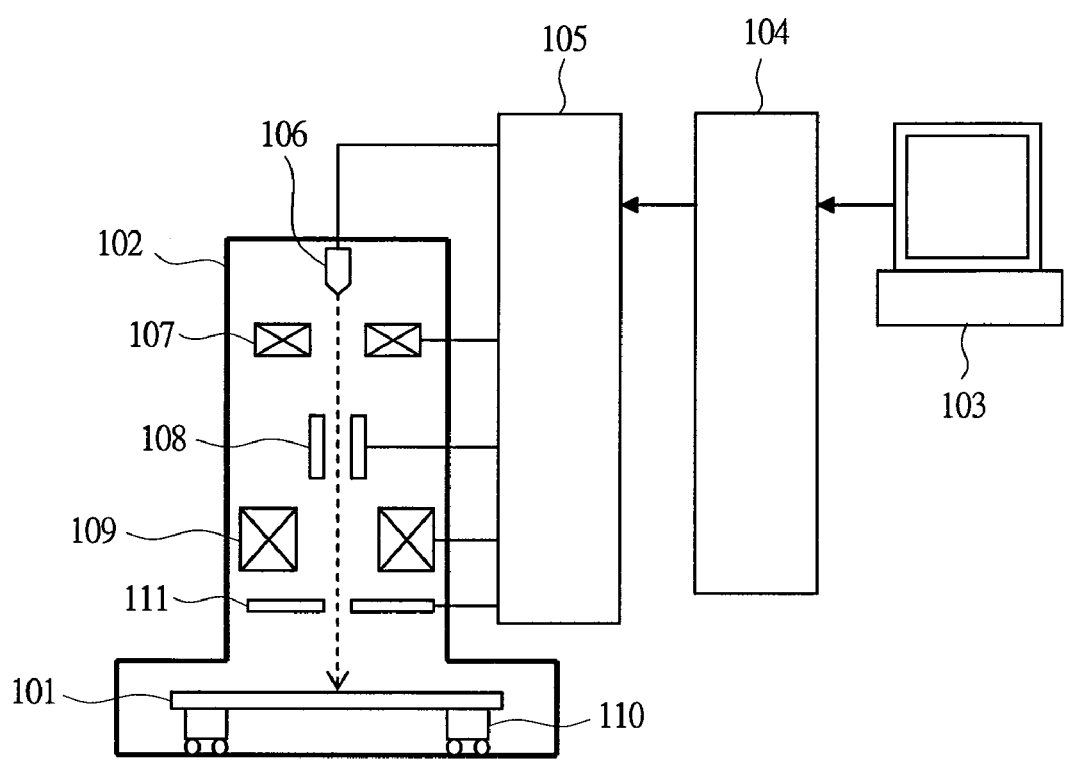
FIG. 1 is a diagram showing a basic configuration of an SEM semiconductor wafer inspection apparatus comprising a means for measuring a contact resistance value between a wafer and a ground electrode, a charging control electrode and a control means for controlling the entire apparatus.

FIG. 1 shows a configuration of an SEM semiconductor wafer inspection apparatus comprising a means for measuring a contact resistance value between a wafer and a ground electrode, a means (charging control electrode) for controlling potential by charging of a wafer surface and a control means for controlling the entire apparatus.

The inspection apparatus using an electron beam is mainly composed of a sample chamber 102 keeping an electron optical system vacuum, and holding and moving a sample 101 such as a wafer, a control computer 103, an optical system control unit 104 and a power source unit 105. Here, a configuration of the electron optical system comprises an electron source 101, a condenser lens 102, a deflector 103 and an objective lens 104. Note that, although a representative electron optical system configuration is illustrated herein, the present invention is not limited thereto and other electron optical system can be used. The electron beam emitted from an electron source 106 passes through the condenser lens 107, is bent by the deflector 108 and is irradiated on the sample (mainly semiconductor wafer) 101 while being converged by the objective lens 109. An electron optical condition is controlled by the optical system control unit 104 and the power source unit 105. The sample 101 is grounded or has a voltage applied by a sample holder 110 also serving as a ground electrode. The sample holder 110 also serves as a holder for holding the sample 101 simultaneously. In the present embodiment, the sample holder 110 is grounded by a back surface of the sample, but may be grounded by a side surface or an upper surface. Furthermore, a charging control electrode 111 for controlling charging of the sample surface is provided over the upper surface of the sample.

Figure 2:
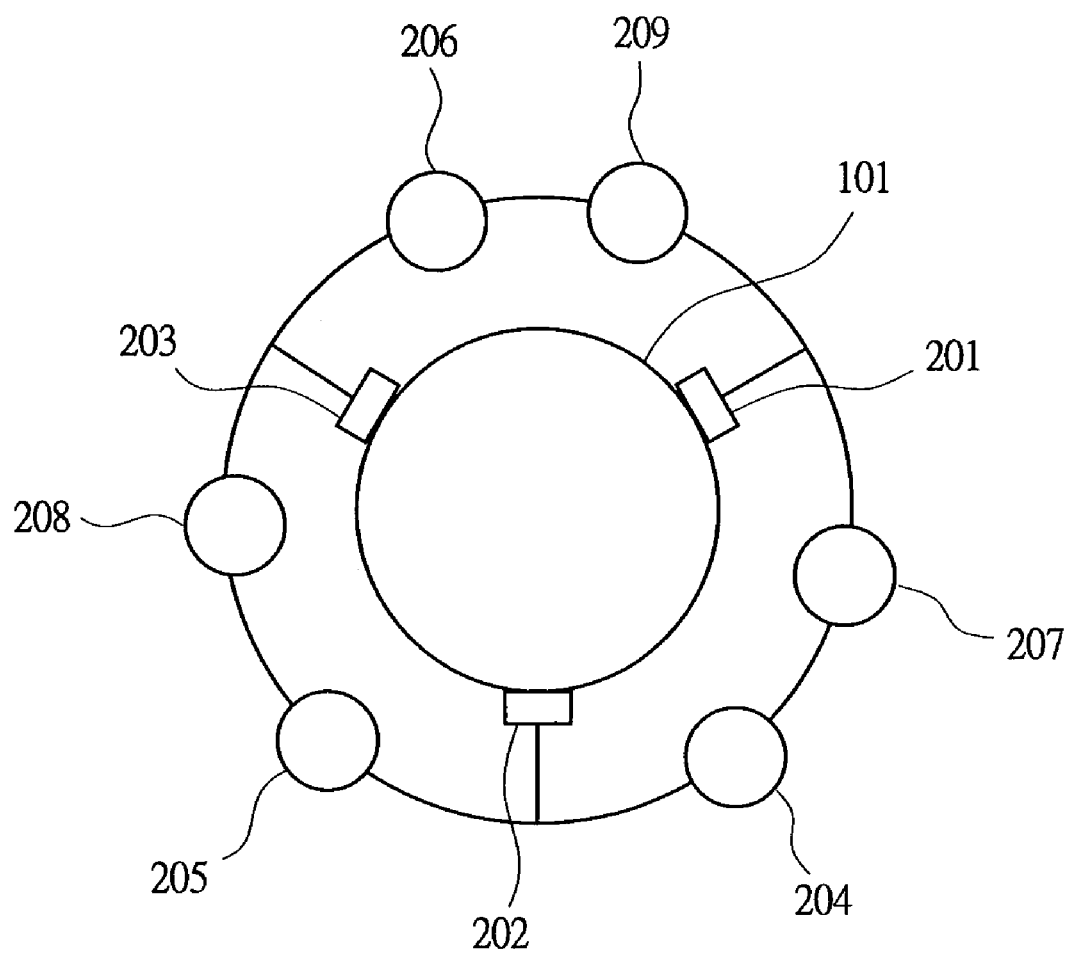
FIG. 2 is a diagram showing a configuration and a method of measuring a contact resistance value between a sample and a sample holder.

Next, a configuration and a method of measuring the contact resistance value between the sample and the sample holder are described using FIG. 2. Between the sample 101 and respective sample holders 201, 202 and 203, direct current (DC) power sources 204, 205 and 206 and ammeters 207, 208 and 209 are provided. Here, the contact resistance values between the sample 101 and respective sample holders 201, 202 and 203 are defined as R1, R2 and R3, respectively. Now, voltages V1, V2 and V3 are applied using the DC power sources 204, 205 and 206. At this point, currents measured by the respective ammeters 207, 208 and 209 are defined as I1, I2 and I3, respectively. Here, values of the voltages V1, V2 and V3 applied may be the same or different. And, the respective voltages V1, V2 and V3 may be adjusted so that the currents I1, I2 and I3 measured in the respective ammeters 207, 208 and 209 become large sufficiently to be measured by the ammeters. In this case, the following equations are held:

$$V1 = I1 \times (R1+R2);$$

$$V2 = I2 \times (R2+R3);\text{ and}$$

$$V3 = I3 \times (R3+R1).$$

By solving the above equations, the contact resistance values R1, R2 and R3 are independently obtained by the following equations:

$$R1 = (V1/I1 - V2/I2 + V3/I3)/2;$$

$$R2 = (V1/I1 + V2/I2 - V3/I3)/2;\text{ and}$$

$$R3 = (-V1/I1 + V2/I2 + V3/I3)/2.$$

As apparent from the above, in the present embodiment, the sample holders at three or more locations will suffice, and even if the sample holders of greater number are provided, the contact resistance value between the respective sample holders and the sample can be measured with a similar method.

And, by connecting all of the power sources and the ammeters described in the present embodiment to the control computer 103 of FIG. 1, measurement of the contact resistance may be automated.

Figure 3:
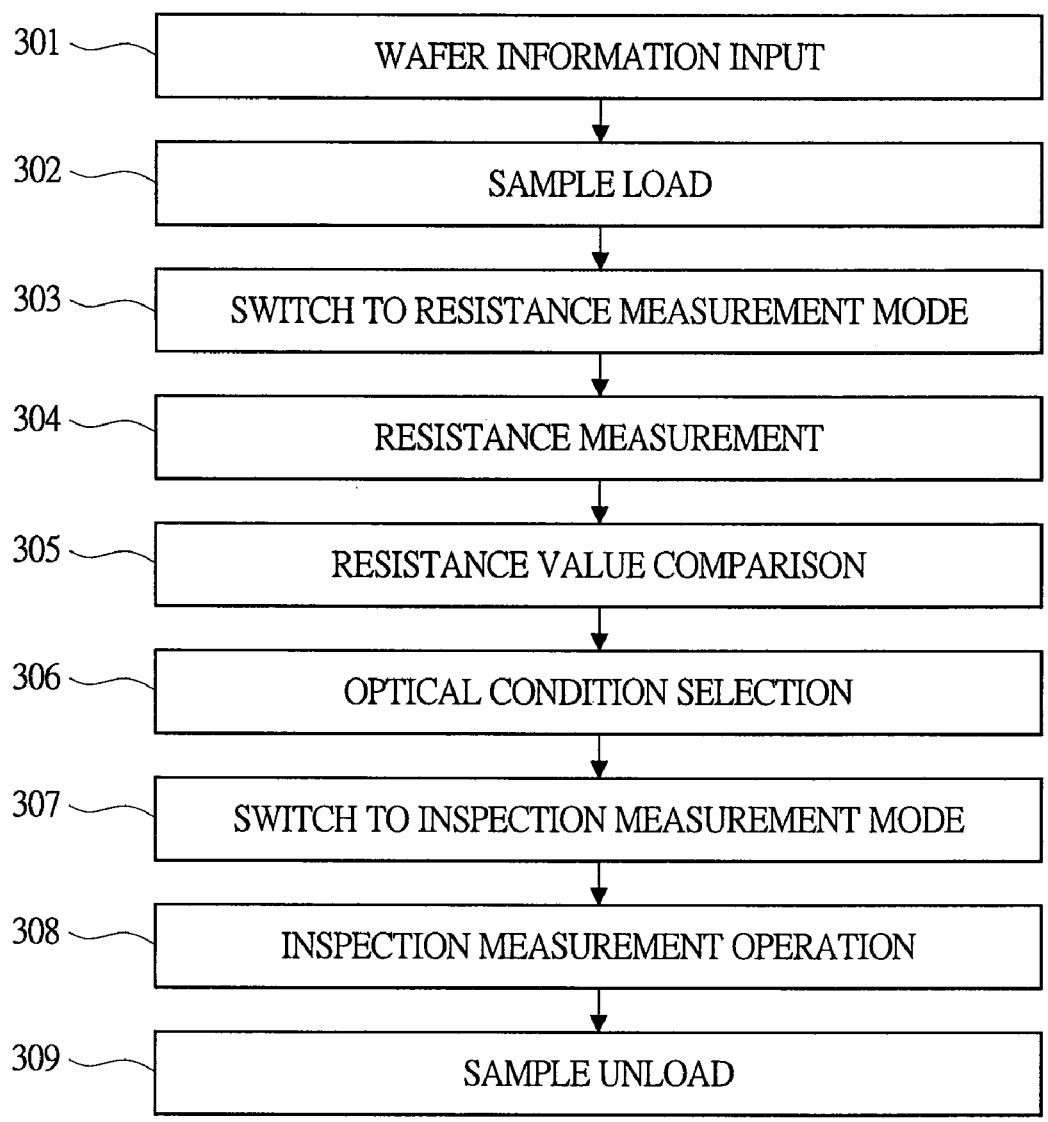
FIG. 3 is a flowchart explaining an outline of a defect inspection recipe of the semiconductor wafer.

Next, according to FIG. 3, an outline of a defect inspection recipe of the semiconductor wafer according to the present embodiment is described using FIG. 1.

First, in step 301, information (wafer information) for defining a wafer surface resistance value of the sample 101 to be inspected is inputted from the control computer 103. Items inputted here are a shape of a pattern formed at the surface of the sample 101, density of a pattern, a step name and the like, and information of the wafer surface resistance value estimated in advance based on this information is stored in the control computer 103. By comparing this information stored in advance and the inputted wafer information, the wafer surface resistance value to be inspected is defined. Next, in step 302, the sample 101 is loaded to the sample chamber 102, and in step 303, switching to a mode for measurement of the contact resistance is performed. In step 304, resistance values of the respective sample holders are measured with the method described in detail using FIG. 2, and stored in the control computer 103. Next, in step 305, the measured resistance values of respective sample holders and the wafer surface resistance value defined in step 101 are compared, and in step 306, the optical condition of the electron optical system and the voltage applied to the charging control electrode 111 are selected according to a result of the comparison of step 305. This is due to the following reasons. An amount of charging formed at the sample surface is defined by a ratio (hereinafter referred to as resistance ratio) between the wafer surface resistance value and the contact resistance value between the sample and the sample holder. This is because when charges necessary for charging are injected to the sample, the charges are distributed according to the resistance ratio. Therefore, even if the same optical condition and application voltage to the charging control electrode 111 are used, a charged state formed on the sample surface varies if the resistance ratio is different. Accordingly, by selecting the optimum optical condition of the electron optical system and the voltage applied to the charging control electrode 111 according to the resistance ratio, the inspection can be performed under an optimum condition. Here, as for the contact resistance value of the sample holder used in calculation of the resistance ratio, the smallest contact resistance value of the values measured in step 303 and stored in the control computer 103 may be used. Next, in step 307, the optical condition and the application voltage to the charging control electrode 111 determined in step 306 are used and the mode is switched to an inspection measurement mode, in step 308, the inspection measurement is performed, and if the measurement is completed, the sample is unloaded in step 309.

By using the present embodiment, the optical condition of the electron optical system and the application voltage to the charging control electrode necessary for the inspection can be set to a state optimum for the inspection depending on the wafer.

Second Embodiment

In the first embodiment, the method and the apparatus for setting the optimum inspection condition according to the ratio between the wafer surface resistance value and the contact resistance value is described in detail. However, the contact resistance value between the wafer and the sample holder sometimes becomes very large depending on a type of the wafer and a state of a contact surface. Therefore, there is a possibility that the optimum inspection condition cannot be obtained with optical conditions and application voltages to the charging control electrode prepared in advance. In this case, management and reduction of the contact resistance value are necessary. In the present embodiment, a method of management and reduction of the contact resistance value and an apparatus thereof are described in detail.

Figure 4:
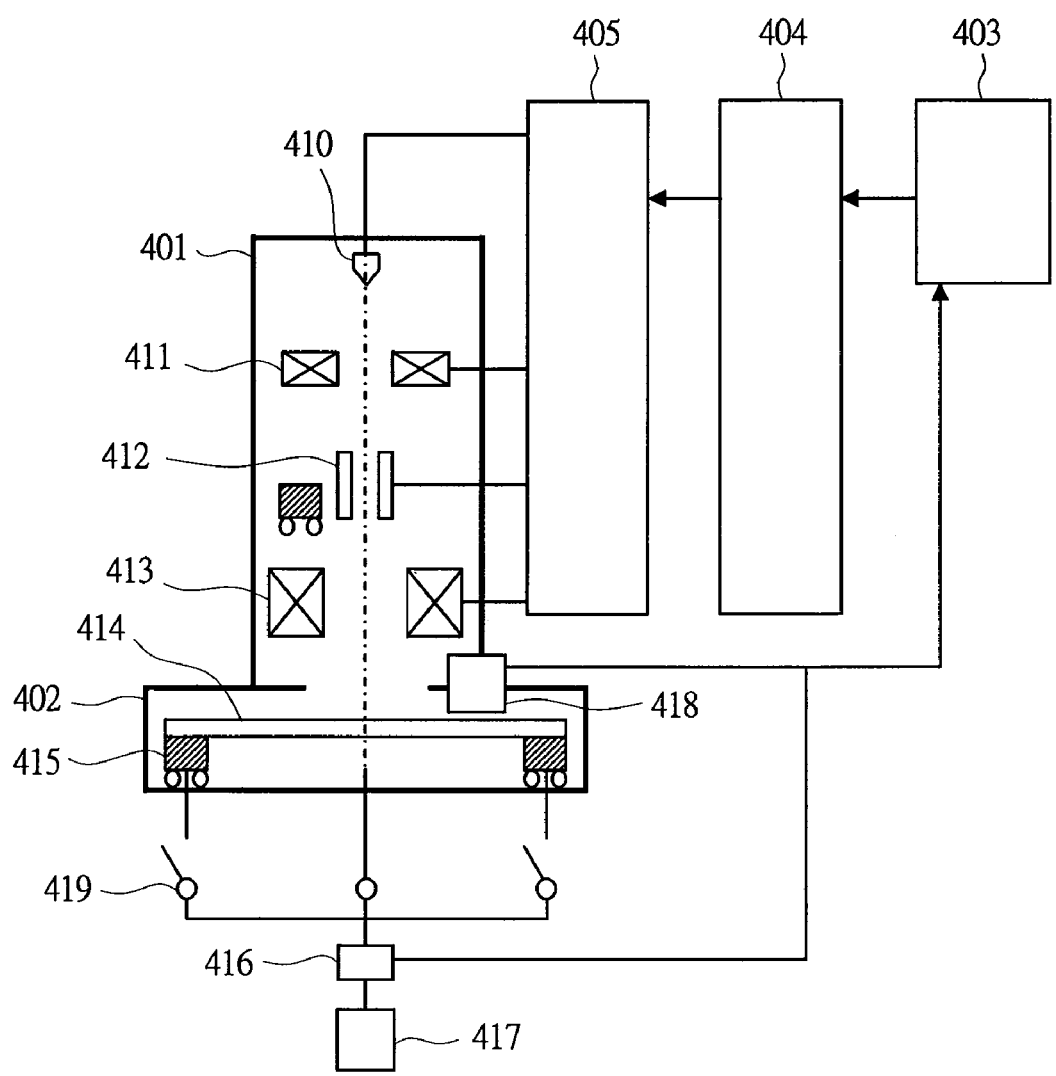
FIG. 4 is a basic schematic diagram of an inspection apparatus using an electron beam comprising a function of reducing a contact resistance.

FIG. 4 is a schematic configuration diagram of an inspection apparatus using an electron beam comprising a mechanism for management and reduction of the contact resistance value from the wafer surface to the ground electrode. The inspection apparatus using the electron beam is mainly composed of a column 401 keeping an optical system vacuum, a sample chamber 402 holding and moving a sample such as a wafer, a control computer 403, an optical system control unit 404 and a power source unit 405. Although a representative optical system configuration is illustrated in the column 401, the present invention is not limited thereto and other optical system can be used. The electron beam emitted from the electron source 410 passes through a condenser lens 411, is bent by a deflector 412 and is irradiated on the sample (mainly wafer) 414 while being converged by an objective lens 413. An optical system is controlled by the optical system control unit 404 and the power source unit 405. The sample 414 is grounded or has a voltage applied by a ground electrode 415. The ground electrode 415 also serves as a holder for holding the sample 414 simultaneously. In the present embodiment, the ground electrode 415 is grounded by a back surface of the sample, but may be grounded by a side surface or an upper surface. In the present embodiment, a power source 417 for applying a voltage to the sample 414 is provided. An absorption current Ir flowing out from the sample 414 and the ground electrode 415 when the electron beam is irradiated is measured by an ammeter 416, a sample voltage of the sample 414 is measured using a voltmeter 418, and thereby, the contact resistance value is measured. As for the sample voltage, a voltage obtained when electron beam irradiation is not carried out is defined as V0, and using difference between the V0 and a voltage V1 obtained when the electron beam irradiation is carried out, the contact resistance value is calculated. A calculation formula of the contact resistance value is shown below:

$$\text{Contact resistance value} = (V0 - V1)/Ir.$$

A contact portion of the sample 414 can be switched by a switch 419, and the contact resistance value of each ground electrode can be measured. By measuring the absorption current and the sample voltage when the electron beam is irradiated, the contact resistance value between the wafer surface and the ground electrode 15 having an effect on actual inspection can be calculated.

Figure 5:
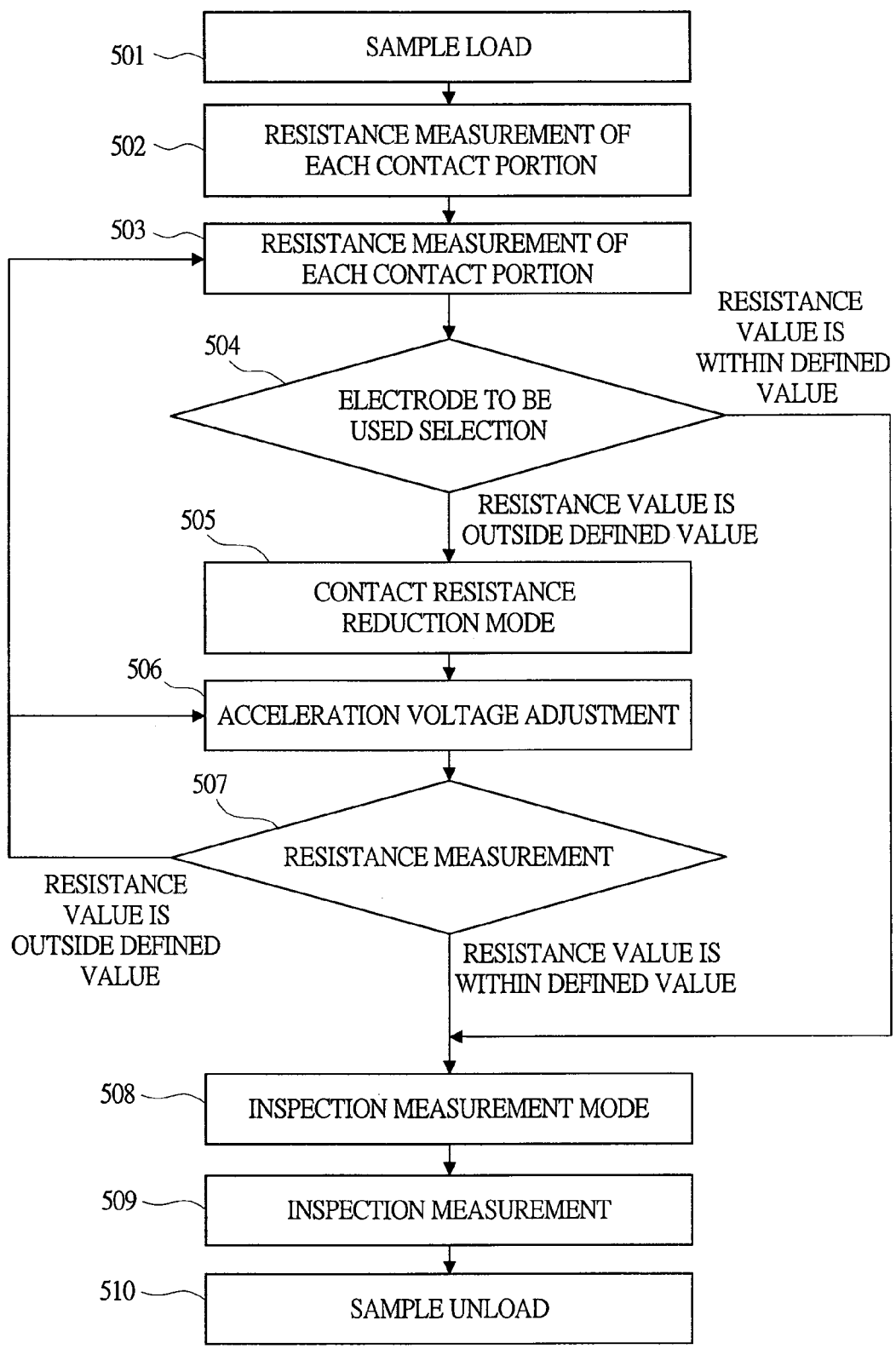
FIG. 5 is a flowchart of a method of management and reduction of the contact resistance.
Figure 6:
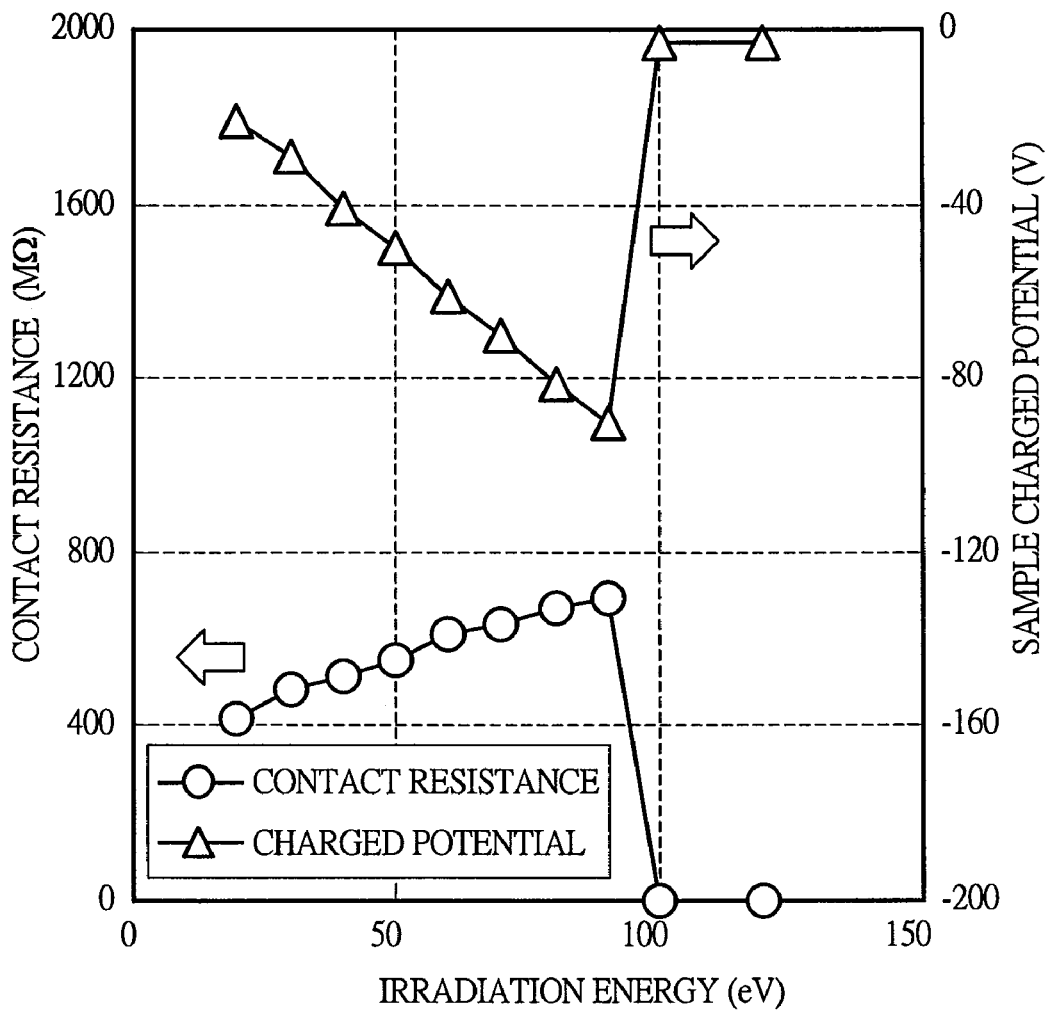
FIG. 6 is a diagram showing a relationship between irradiation energy of a primary electron beam and the contact resistance value.

FIG. 5 is a flowchart of the present embodiment. In step 501, the sample 414 is loaded to the sample chamber 402, and in step 502, switching to a mode for measurement and reduction of the contact resistance is performed. In steps 503 and 504, resistance values R0, R2, . . . of the respective ground electrodes are measured, and a ground electrode having the largest contact resistance is selected as an electrode to be used. At this time, among the resistance values of the ground electrodes, if an electrode having the contact resistance within a defined allowable contact resistance value exists, the electrode is defined as the electrode to be used, and a process mentioned above transits to an inspection mode, that is, step 508. The allowable contact resistance value is preferably lower than or equal to 10 MΩ. By defining the electrode having a large contact resistance value as the electrode to be used, the resistance value can be reduced certainly. Although a configuration in which the electrode to be used is selected from three ground electrodes is employed in the present embodiment, the number of the ground electrodes is not limited and a shape and a contact area of the ground electrode may be changed. In step 505, the mode is switched to a mode reducing the contact resistance. In the present embodiment, a method of causing breakdown in the sample 414 and the selected electrode to be used by irradiating the electron beam of low acceleration energy is used. Since the electron beam of low acceleration energy is stored in a substrate of the sample 414 regardless of a structure of the surface of the sample 414, a potential difference corresponding to an acceleration voltage of the irradiated electron beam is generated at a contact resistance portion. In order to make the potential difference large, it is preferable to make an initial contact resistance value large. If the acceleration voltage of the electron beam to be irradiated is adjusted and charged potential of the sample is made large, breakdown occurs when the charged potential reaches a breakdown voltage of the sample 414 and a contact portion of the selected electrode to be used and the contact resistance is reduced. As shown in FIG. 6, in the present embodiment, the breakdown occurs at approximately 100 eV and the contact resistance is reduced to 0.6 MΩ. In step 506, the acceleration voltage is adjusted and the breakdown is caused. In step 507, the contact resistance value is checked again, and if the contact resistance value is within a defined range, the mode is switched to the inspection mode in step 508, and inspection is carried out. If the contact resistance value is outside the range, the process returns again to step 505 of reducing the contact resistance, and the contact resistance is reduced. If the contact resistance value is still outside the defined range, the process returns to step 503 selecting the electrode to be used, and selection of the electrode to be used is performed again.

By using the present embodiment, the contact resistance value from the wafer surface to the ground electrode which is important in the inspection can be managed and reduced.

Third Embodiment

Figure 7:
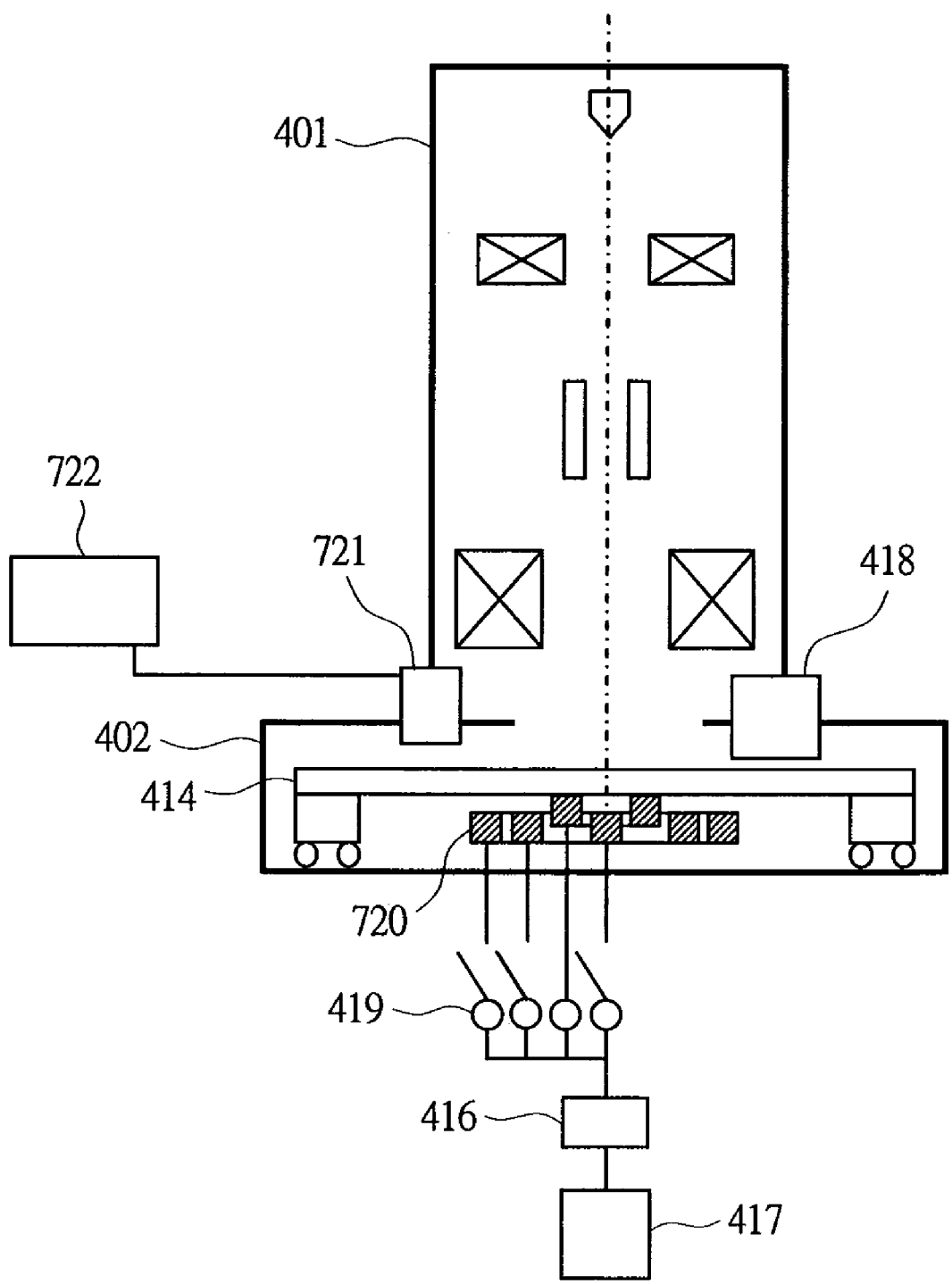
FIG. 7 is a schematic diagram of an inspection apparatus comprising a function of reducing the contact resistance.

FIG. 7 is a schematic configuration diagram of an inspection apparatus using an electron beam comprising a ground electrode capable of switching an electrode area and an electron gun for reduction of contact resistance. A ground electrode 720 is composed of multi-concentric electrodes and a contact area with the sample 414 can be switched. A contact resistance value corresponding to each contact area is measured, and the ground electrode causing a large contact resistance is selected as the electrode to be used. In the present embodiment, in order to reduce the contact resistance efficiently, the electron gun uses, in addition to the electron beam used in the inspection, an electron gun 721 for reduction of the contact resistance arranged separately. The electron gun 721 can be used in vacuum of a degree similar with that of the sample chamber, and is preferably capable of irradiating an electron beam of a large current at low acceleration energy. For example, an electron gun of a carbon nanotube type or the like is desirable. The acceleration energy of the electron beam irradiated by the electron gun 721 is adjusted by a power source unit 722 for adjustment of an acceleration voltage, breakdown between the sample 414 and the ground electrode 720 is caused and the contact resistance value from the sample surface to the ground electrode 720 is reduced.

The present invention can be utilized in an inspection apparatus using an electron beam.

What is claimed is:

1. An electron beam application apparatus including an electron optical system performing irradiation of a primary electron beam with predetermined irradiation condition to a sample, detecting a secondary charged particle generated by the irradiation of the primary electron beam and outputting a detection signal, and performing one of measurement and inspection of the sample using the detection signal, comprising:
    a sample holder having a first part, second part, and third part to contact and hold a sample;
    a first power source and first ammeter between the first part and the second part of the sample holder, a second power source and a second ammeter between the second part and the third part of the sample holders and a third voltage source and a third ammeter between the third part and the first part of the sample holders, wherein each of the ammeters measures current with respect to predetermined voltages supplied by the power sources and, and
    a control computer calculating contact resistance values for each of said first, second and third parts of the sample holder from the measured currents of the first, second and third ammeters and the predetermined voltages applied by said first, second and third power sources, respectively, and,
    wherein the control computer controls an irradiation condition of the electron optical system based on the calculated contact resistance values.

2. The electron beam application apparatus according to claim 1, further comprising:
    wherein the control computer defines a surface resistance value of the sample, and
    wherein the control computer adjusts the irradiation condition based on a ratio between the smallest value of the first, second and third contact resistance values and the surface resistance value.

3. The electron beam application apparatus according to claim 1, further comprising:
    wherein the control computer stores a surface resistance value of the sample and at least one of a shape of a pattern formed on the sample, density of the pattern and a step name of a processing step performed to the sample as information before the information of the sample to be inspected is input to the control computer, and,
    wherein the control computer reads out the surface resistance value based on the information inputted, calculates a ratio between the contact resistance values and the surface resistance value and adjusts the electron optical system based on the ratio.

4. The electron beam application apparatus according to claim 1,
    wherein the electron optical system comprises a charging control electrode arranged to oppose the sample holder, and
    wherein at least one of irradiation energy of the primary electron beam, a current value and a voltage applied to the charging control electrode is determined as the irradiation condition.

5. An electron beam application apparatus including an electron optical system performing irradiation of a primary electron beam with predetermined irradiation condition to a sample, detecting a secondary charged particle generated by the irradiation of the primary electron beam and outputting a detection signal, and performing one of measurement and inspection of the sample using the detection signal, comprising:
    a sample holder to hold a sample;
    a ground electrode in contact with a surface of a sample held in the sample holder;
    an ammeter measuring an absorption current and a voltmeter measuring a voltage of a sample held by said sample holder
    a control computer calculating a contact resistance value between a sample surface and the ground electrode from measured current and voltage of a sample held by the sample holder when a predetermined acceleration voltage is applied to the primary electron beam,
    wherein the control computer controls an irradiation condition of the electron optical system based on the calculated contact resistance value; and
    wherein a mode reduces the contact resistance value between a sample and the ground electrode by applying a predetermined acceleration voltage to a sample so that a charged potential of a sample is increased and breakdown is reached between the sample and the ground electrode.

* * * * *